United States Patent [19]
Smith et al.

[11] Patent Number: 4,754,173
[45] Date of Patent: Jun. 28, 1988

[54] EMITTER COUPLED LOGIC LATCH WITH BOOLEAN LOGIC INPUT GATING NETWORK

[75] Inventors: William H. Smith, Cupertino, Calif.; Richard L. Doucette, Hopkinton, Mass.

[73] Assignee: Digital Equipment Corporation, Maynard, Mass.

[21] Appl. No.: 117,387

[22] Filed: Oct. 30, 1987

Related U.S. Application Data

[63] Continuation of Ser. No. 744,405, Jun. 13, 1985, abandoned.

[51] Int. Cl.$^4$ ...................... H03K 19/086; H03F 3/45
[52] U.S. Cl. ..................................... 307/455; 307/467; 307/530
[58] Field of Search ............... 307/254, 255, 455, 467, 307/530

[56] References Cited

U.S. PATENT DOCUMENTS

| | | | |
|---|---|---|---|
| 3,446,989 | 5/1969 | Allen et al. | 307/455 |
| 3,906,212 | 9/1975 | Poquntke | 307/455 |
| 4,145,623 | 3/1979 | Doucette | 307/467 |
| 4,580,066 | 4/1986 | Berndt | 307/467 |

Primary Examiner—Stanley D. Miller
Assistant Examiner—B. P. Davis
Attorney, Agent, or Firm—Cesari & McKenna

[57] ABSTRACT

A latch circuit including an input logic network that incorporates emitter-coupled logic switching arrangements connected in multiple levels to perform logical operations on the received input signals. The latch circuit is controlled by differential clock signals coupled to a differential switch circuit that is connected to the input logic network to form another switch level. An output buffer is connected to the input logic network to generate output signals of selected logic voltage levels. When the differential clock signals are in a pass condition, the input logic network is enabled to transmit an output signal to the output buffer. When the differential clock signals are in a latch, or hold, condition, the input logic network is disabled and a feedback network is enabled to maintain the signal to the output buffer in the conditions it was in when the differential clock signals changed conditions.

16 Claims, 1 Drawing Sheet

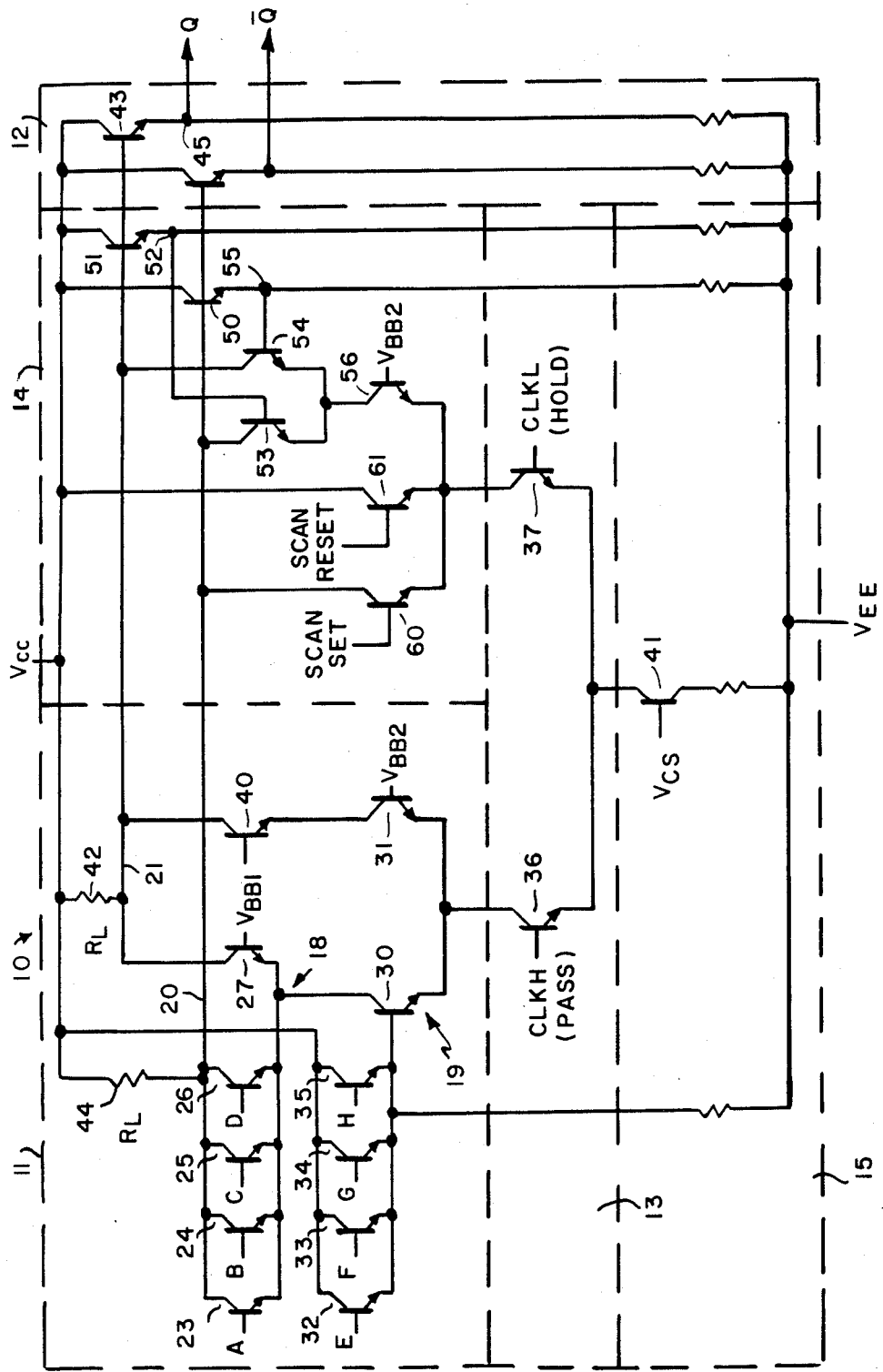

EMITTER COUPLED LOGIC LATCH WITH BOOLEAN LOGIC INPUT GATING NETWORK

This application is a continuation of application Ser. No. 744,405 filed June 13, 1985 and now abandoned.

BACKGROUND OF THE INVENTION

1. Field of the Invention

The invention relates generally to electronic digital logic circuits, and more specifically to latch circuits having input gating networks which are constructed in accordance with emitter coupled logic design techniques.

2. Description of the Prior Art

Emitter coupled logic circuits, which, with current mode logic circuits, form a type of switch circuit generally referred to as current steering logic, were first developed a number of years ago to provide extremely fast switching times in digital applications. In an emitter coupled logic circuit, a pair of high-gain transistors are used in which the emitters are connected together to form a node to which a constant current source is also connected. The current source limits the total amount of current which is permitted to flow through both transistors at any one time. The base of one of the transistors, termed here a "reference transistor", is connected to a reference voltage and the base of the other transistor, termed here an "input transistor", is connected to the input signal. When the potential, or voltage, level of the input signal is significantly below that of the reference, the reference transistor is turned on so as to conduct current and, if the input signal is low enough, the input transistor is off. When the voltage level of the input signal increases to a point near that of the reference, the input transistor also begins to turn on. With the level of the input signal rising, the input transistor responds by conducting an increasing amount of current thereby increasing the potential level of the node controlled by the current source. Since the potential level of the node is increasing, the potential difference between the base and the emitter of the reference transistor decreases and the reference transistor begins to turn off. Eventually, the level of the input signal increases to a point at which the heavy current through the input transistor causes current starvation through the reference transistor. When the input signal again falls, the reverse operation occurs. The circuit comprising the two transistors and the constant current source essentially forms a two-state switch, with the states of the switch being reflected in the two transistors being alternately on and off, with the input signal operating to steer current between the two transistors.

Emitter coupled logic circuits have been used for a number of years in digital applications which required relatively fast switching speeds. In current emitter coupled logic circuits, neither the input transistor nor the reference transistor is turned completely off or driven into saturation. Instead, the states of the switch are reflected in the relative current levels of the transistors. Since neither transistor is driven into saturation, the states of a logic transistor pair can be switched very rapidly, especially if the current levels reflecting the states are close together. Furthermore, since the two transistors have complementary states, it is possible to obtain complementary output signals with no additional circuitry.

In many applications, it is desirable to provide a latch circuit which has multiple stages of Boolean logic functions as the input. The latch circuit transmits the Boolean result of the input logic network as an output signal as long as a clock signal is in a selected condition indicating that the Boolean result should be passed. When the clock signal shifts to a complementary condition and while it remains in that condition, the latch circuit is in a hold condition in which it holds the state of the prior passed signal, and continues to transmit it as the output signal.

A performance problem with such prior latch circuits is that they typically had two emitter coupled logic switch circuits in time sequence, between the input terminals and the output terminals. The composite Boolean input gating logic portion of the circuit was formed within one emitter coupled logic switch, and the latch was connected from the output of the gating logic, was also formed from a seperate emitter coupled logic switch. This circuit arrangement requires two current switching times, one for each of the sequentially connected emitter coupled logic switches, to allow the resulting signal to be propagated from the Boolean input terminals of the circuit to the latch output terminals.

SUMMARY OF THE INVENTION

The invention provides a new and improved latch circuit including emitter coupled, or current mode, logic switch circuits, in which an input network performs multiple Boolean logic operations on the input signals (for example, OR-AND, NAND-NOR or equivalent) and in which only a single current switching time is required from the time the input signals are applied until new Boolean output signals are propagated from the output terminals of the latch.

In brief, the invention provides a latch circuit having an input Boolean logic gating network formed from multiple levels of current mode logic switching circuits. The input Boolean logic input network receives input signals divided into at least two groups, performs an initial Boolean logic operation on the input signals of each group, and also performs a second Boolean logic operation on the signals that result from the initial operation. The Boolean logic input network comprises a plurality of emitter coupled logic switches connected in a like plurality of levels, one level associated with each of the groups of input signals, and a third switch level which receives and responds to a differential pair of clock signals having a pass condition and a hold condition. When the clock signals are in the pass condition, the output of the Boolean logic input network is coupled to an output buffer which transmits a buffered output signal, and also to a feedback network including feedback transistors which latch the voltage levels of the signals from the Boolean logic input network when the differential clock signal shifts from the pass condition to the hold condition.

Since the input Boolean network is connected directly to the output transistors of the latch circuit, the propagation time from the input of the Boolean logic input network to the output of the output buffer is on the order of one current switch time, namely, that of the emitter coupled logic switches in the Boolean logic input network rather than two sequential switch times as was required for prior circuits.

BRIEF DESCRIPTION OF THE DRAWING

The invention is pointed out with particularity in the appended claims. The above and further advantages of the invention will be apparent on reference to the following Detailed Description of a Preferred Embodiment when taken in connection with the accompanying drawing in which the figure is a schematic circuit diagram of a latch circuit constructed in accordance with the invention.

DETAILED DESCRIPTION OF AN ILLUSTRATIVE EMBODIMENT

With reference to the figure, a latch circuit 10 constructed in accordance with the invention includes a Boolean logic input network 11 which performs Boolean logic operations on input signals A through H. The output signals from the Boolean logic input network are coupled on lines 20 and 21 to an output buffer circuit 12 when a differential pair of clock signals CLK H and CLK L, which are coupled to a clock control circuit 13, are in a selected (pass) condition. The output buffer circuit, in response to the voltage levels representing the signals on lines 20 and 21, transmits complementary Q and Q-bar output signals to downstream circuitry (not shown). When the differential clock signals switch their conditions to a second, hold, state, a feedback network 14 holds and maintains the output signals in their conditions at the time the condition of the clock signals switched from the pass condition to the hold condition. While the clock signals are in the hold state, if a SCAN SET or a SCAN RESET signal is in an asserted (that is, high) condition, the Q and Q-bar output signals are enabled to assume selected states. The circuit also includes a current source 15 for supporting and maintaining the emitter coupled logic circuits.

If the differential clock signals are in a pass condition, with a CLK H signal asserted and a CLK L signal negated, the input Boolean logic gating network 11 in the circuit depicted in the Figure provides an OR-AND Boolean logic on the input signals A through H. Specifically, the input signals A through D are ORed together, as are the input signals E through H. The result of the two OR operations is then ANDed, and the result of the AND operation is reflected in the voltage level of the signals transmitted on lines 20 and 21 to output buffer 12.

The Boolean logic input network 11 includes two vertically, or serially, connected emitter coupled logic switch levels 18 and 19 for performing an AND logic operation. The OR logic operation on signals A through D is accomplished by parallel-connected transistors 23 through 26 and the OR logic operation on signals E through F is accomplished by parallel-connected transistors 32 through 35. The network 11 is controlled by a clock pass transistor 36 which is energized to enable levels 18 and 19 when the CLK H clock signal is asserted.

Specifically, transistors 23 through 26, which are controlled by the input signals A through D, with transistor 27 form an emitter coupled logic switch network, with transistors 23 through 26 comprising the input transistors and transistor 27 comprising a reference transistor controlled by a Vbb1 reference or comparison voltage. The current source for the first level emitter-coupled logic switch 18 is provided by the second level emitter-coupled logic switch 19, and specifically by a transistor 30. If transistor 30 is turned on, the first level emitter-coupled logic switch 18 is operative, otherwise the switch 18 is disabled and all transistors 23 through 27 are off. If transistor 30 is on, and if all of the input signals A through D are in the low voltage (negated) state, transistor 27 is maintained in the on condition by the Vbb1 reference voltage applied to its base terminal. If any of the A through D input signals are in the high (asserted) condition, the corresponding transistors are energized if transistors 30 and 36 are on. Since at least one of transistors 23 through 26 is turned on, transistor 27 is turned off.

The second level emitter-coupled logic switch 19 is formed from a pair of transistors 30 and 31, with transistor 30 comprising the input transistor and transistor 31 comprising the reference transistor controlled by a Vbb2 reference voltage. The clock control circuit 13, specifically transistor 36, provides the current source for the second level emitter-coupled logic switch 19. If the differential clock signals are in the pass condition, the switch 19 is operative, otherwise switch 19 is disabled and both transistors 30 and 31 are off. Transistor 30 is also off if all of transistors 32 through 35 are off, which occurs if all of the input signals E through H are in the low (negated) state. However, if any of the input signals E through H are asserted (in the high voltage condition), the corresponding transistor 32 through 35 is also on, which enables transistor 30 to also turn on if the differential clock signals are in the pass condition. In this condition, transistor 31 is turned off.

While transistor 30 is off, reference transistor 31, controlled by the Vbb2 second logic level reference signal, will be on if the differential clock signals are in the pass condition so that transistor 36 is on. The Boolean logic input network 11 also includes a transistor 40 in series with transistor 31 and controlled by the Vbb1 reference voltage. This transistor 40 is paired with transistor 27 to provide a first level voltage drop from line 21, to which both transistors 27 and 40 are connected, for transistor 31, to compensate for the voltage drop provided by the second level emitter-coupled logic switch 19 for transistor 30.

The clock control circuit 13 comprises transistors 36 and 37, which jointly form a third level emitter-coupled current switch, with the current source 15 providing the current source for their emitter coupled logic switch. Transistors 36 and 37 are controlled respectively by the differential clock signals CLK H and CLK L (clock Phase High and clock Phase Low). When the clock signals are in the pass condition, the CLK H clock signal is asserted (high) and the CLK L clock signal is negated (low), transistor 36 is energized (on), and transistor 37 is off. However, when the clock signals are in the hold condition, the CLK L signal is asserted (high) and the CLK H signal is negated (low), transistor 37 is energized (on) and transistor 36 is off.

When the CLK H clock signal is asserted, the transistor 36 is energized to pass current from the input Boolean logic gating network 11 to the current source 15 and specifically to a transistor 41 that is biased by a signal Vcs to provide a constant current source. When none of the A through H input signals is asserted, the current that is coupled to the current source is provided by transistors 40 and 31. In this situation, a voltage drop occurs across resister 42, from the voltage level provided by the collector power supply Vcc, to line 21. Thus, the voltage level of line 21 is lower than the voltage level of line 20, causing a reduction in the amount of current provided at the emitter of a transistor 43, which is connected as an emitter-follower in the output buffer 12. Thus, the output signal from transistor 43, the Q output signal, has a low, or negated, state. Furthermore, since the A through H input signals are negated, the transistors 23 through 26 and 30 are off, and so very little, if any, current flows through a resistor 44. Accordingly, the voltage level of line 20 is maintained at or near the Vcc level provided by the collector power supply. In that condition, a transistor 45 also connected as an emitter follower is on more heavily than is transistor 43, providing a greater current, and its output signal, namely the Q-bar signal, is asserted (high).

If the CLK H clock signal is asserted, and if all of the input signals E through H are negated, transistor 31 will be on and transistor 30 will be off. Thus, whether the input signals A through D are in their high or low conditions, no current flows through any of transistors 23 through 27, and, accordingly, the voltage level of line 20 is maintained at or near the Vcc collector voltage power supply level and transistor 45 is more heavily on than is transistor 43. In this condition, the Q-bar output signal is maintained at an asserted (high) level and the Q output signal is negated.

If the CLK H clock signal is asserted, and if all of the A through D input signals are negated and at least one of the E through H input signals is asserted, transistor 30 is turned on and transistor 31 is turned off. Thus, no current flows through the current path comprising transistors 40 and 31. However, since the input signals A through D are negated, transistor 27 is energized, and a current path is established from line 21 through transistors 27 and 30 to transistor 36, and current is blocked from line 20. Thus, the voltage level on line 20 is high, specifically at a level near the Vcc voltage level, and the voltage level on line 21 is low. Thus lines 21 and 20, transistors 43 and 45, and the resulting Q and Q-bar output signals have the same conditions as described in the preceeding paragraph.

If the CLK H clock signal is asserted, and if at least one of A through D signals is asserted, the corresponding transistor 23 through 26 is energized, turning off transistor 27. If at least one of the E through H input signals is also asserted, its corresponding transistor 32 through 35 will also be energized, thereby turning on transistor 30. A current path thus exists through one or more of the transistors 23 through 26 that are on, through transistors 30 and 36 and to the constant current source transistor 41. Thus, current flows through resister 44 to pull the voltage level of line 20 low, causing a reduction in the current through transistor 45, thereby causing the Q-bar output signal to drop to a negated state. Since transistor 30 is on, transistor 31 is off, blocking current from flowing through transistors 40 and 31 from line 21. Furthermore, transistor 27 will be off, and so little, if any, current flows therethrough from line 21. Since no current flows from line 21, no voltage drop occurs across resister 42, and line 21 is maintained at the high voltage level, that is, at a level at or near the Vcc power supply. Thus transistor 43 is more heavily on than is transistor 45, enabling the Q signal to be high (asserted).

Thus, it will be appreciated that, while the CLK H signal is asserted, causing transistor 36 to pass current from the Boolean logic gating network 11, the Q and Q-bar output signals will reflect the conditions of the A through H input signals. Furthermore, since the emitter coupled logic switches for the two sets of input logic signals are connected in two levels with the CLK H and CLK L clock signals applied to their respective logic switches at the same time, only one current switch transition time is required after the input signals are applied for the logical result to be reflected in the Q and Q-bar output signals.

The voltage levels of the signals on lines 20 and 21 also condition the base terminals of a pair of transistors 50 and 51 connected as emitter followers in the latch-back or holding network 14, which are energized in synchronism with transistors 45 and 43, respectfully. Thus, if the line 21 is energized to a high voltage level, which occurs when the Q-output signal is asserted, transistor 51 is, like transistor 43, more heavily on, energizing an output node 52 to a high voltage level. Node 52 also controls the base of a feedback transistor 53 so that, when node 52 is energized, transistor 53 is enabled. Similarly, a second feedback transistor 54 is controlled by the voltage level of a node 55. Node 55 corresponds to the output terminal of transistor 50, which in turn is controlled by the voltage on line 20. If the voltage on line 20 is high, which occurs to force the Q-bar signal to a high (asserted) level, transistor 54 is also enabled.

If the SCAN SET and SCAN RESET signals are negated, a transistor 56, controlled by the Vbb2 reference voltage, is enabled. Thus, if the CLK H signal goes low and the CLK L signal goes high, transistor 37 is energized. In this polarity of the differential clock signals, they are in the HOLD condition. In that case, a current path is thus established through transistors 37 and 56, and the one of the feedback transistors 53 or 54 which is enabled, to the respective line 20 or 21.

Thus, for example, if the line 21 is initially energized to a high voltage level when the CLK H and CLK L clock signals are in the pass condition, the Q signal is asserted and the Q-bar signal is negated. In that condition, transistor 51 is also more heavily on and transistor 50 is less heavily on. In addition, transistor 54 is off and transistor 53 is energized. Thus, when the state of the differential clock signals CLK H and CLK L changes to the hold condition, with the CLK H signal negated (low) and the CLK L signal asserted (high), transistor 36 turns off and transistor 37 turns on. Transistor 36 thus blocks any current passing from lines 20 or 21 in the Boolean logic input network 11. However, since transistor 37 is on, a current path is established from line 20 and through transistors 53, 56 and 37 to current source 15. Thus, a voltage drop is sustained across resistor 44 from the Vcc collector power supply level. In addition, since transistor 54 is off, no current path exists from line 21. Thus, the voltage levels on lines 20 and 21 remain in the conditions they were in when the differential clock signals switched states, and so the transistors 43 and 45 in output buffer 12 also remain in their prior conditions, as do the Q and Q-bar output signals.

It is readily apparent that, if the voltage level on line 20 is initially high and on line 21 is low when the differential clock signals switch from the pass to the hold condition, they will remain at their respective levels. Thus, when the lines 20 and 21 are in either condition, when the differential clock signals are in the pass condition, they will remain in their respective conditions when the clock signals shift to the hold condition.

The SCAN SET and SCAN RESET signals are only operative to effect the state of the Q and Q-bar output signals when the differential clock signals are in the hold condition, that is, when the CLK L signal is asserted and the CLK H signal is negated. The SCAN SET and SCAN RESET signals are not both asserted at the same time. When the SCAN SET signal is asserted, circuit 14 asserts the Q output signal and negates the Q-bar signal. When the SCAN RESET signal is asserted, circuit 14 negates the Q output signal and asserts the Q-bar output signal.

Specifically, when the SCAN SET signal is asserted (high) a transistor 60 is enabled to turn on, turning off transistor 56 and thereby interrupting the holding current path through transistor 56 and whichever of transistors 53 or 54 is on. A current path is thus established from line 20 through transistors 60 and 37, causing the voltage level on line 20 to fall, thus causing a reduction in current through transistor 45. In this condition, the Q-bar signal is negated. Since transistor 45 is less heavily on, transistor 50 is also less heavily on, causing node 55 to go low and disabling transistor 54.

When the SCAN SET signal is asserted, the SCAN RESET signal must be negated, therefore transistor 61 will be off. In this condition, since there is no current path from line 21 to transistor 37, the voltage level on line 21 goes high, and transistors 51 and 43 are turned more heavily on so that the Q signal is asserted (high). Since transistor 51 is heavily on, the voltage on node 52 is high, which enables feedback transistor 53.

In this condition, when the SCAN SET signal goes low, turning off transistor 60 and turning on transistor 56, a current path is established through enabled transistor 53 and transistor 56, which maintains the voltage on line 20 at a low level through resistor 44. Further, since transistor 54 was disabled when the SCAN SET signal was asserted, it remains deenergized when it is negated thereby blocking current from line 21, and so the voltage on line 21 remains high after the SCAN SET signal is negated. Thus, the conditions of lines 20 and 21 are not changed when the SCAN SET signal is negated, and so the conditions of the Q and Q-bar signals are also unchanged.

When the SCAN RESET signal is asserted, similar operations occur as described above with respect to the SCAN SET signal, except that the voltage levels on lines 20 and 21 are reversed, as are the conditions of transistors 43, 45, 50, 51, 53, 54, 60 and 61 and the conditions of the Q and Q-bar output signals. The high SCAN RESET signal turns on a transistor 61 connected between line 21 and transistor 37, causing the voltage on line 21 to be dropped to a low level across resistor 42. In this condition, transistors 51 and 43 are less heavily on, negating the Q signal and forcing the voltage level at node 52 to be low. Since the voltage level of node 52 is low, transistor 53 is also disabled. Further, since transistor 60 is also off because of the negated SCAN SET signal, the voltage level of line 20 is high, which turns transistors 50 and 45 more heavily on and causes the Q-bar signal to be asserted. Since transistor 50 is more heavily on, the voltage level of node 55 is high, which enables feedback transistor 54. When the SCAN RESET signal is negated, which turns off transistor 61 and turns on transistor 56, enabled transistor 54 turns on, creating a current path from line 21 through transistors 56 and 37 and holding a reduction in the voltage level on the line 21. Since transistor 53 is disabled, it remains off after the SCAN RESET signal is negated, and so the voltage level on line 20 remains high. Thus, when the transistor 56 is again enabled by the negation of the SCAN RESET signal, the Q and Q-bar output signals are maintained by transistors 50, 51, 53 and 54 in their respective conditions as existed while the SCAN RESET signal was asserted.

It will be appreciated by those skilled in the art that a single dual-emitter transistor may be used in place of transistors 43 and 51, and a second dual-emitter transistor may be used in place of transistors 45 and 50. Circuit 10 thus comprises a latch circuit using current steering logic switches having a multiple-level series connected switches in the input network to provide multiple or composite (OR-AND or NAND-NOR) Boolean operations on the input signals, and in which the propogation time from the input terminals to the output terminals is only one current switch transition time of the current steering logic network. Since prior known current steering logic latch circuits used multiple or sequential current mode logic switches that were horizontally-connected, such that, for example, the input logical operations occurred in one switch, or set of switches, and the latch included a second switch connected sequentially, two current switch transition times were required for the output signal to be transmitted following appreciation of the input signals to the input terminals. The circuit described herein thus reduces the propogation delay significantly; indeed, the output from the Boolean logic input network 11 is transmitted directly to the output emitter followers, and so the Q and Q-bar output signals are transmitted more rapidly than in prior circuits.

A further advantage of the instant circuit is that, since the differential CLK H and CLK L clock signals are coupled to the third level of the current mode logic switches in the input logic network 11, the amplitude of the clock signal may be lower than otherwise and remain immune to noise inherent in intermixing various types of logic circuits.

While the invention has been described in connection with an OR-AND input circuit, it will be readily apparent to those skilled in the art that the input logic network could be formed from logic networks which perform many diverse logic operations, and still attain at least some of the benefits of the invention.

The foregoing description is limited to a specific embodiment of this invention. It will be apparent, however, that this invention can be practiced in systems having diverse basic construction or that use different internal circuitry than is described in the specification with the attainment of some or all of the advantages of this invention. Therefore, it is the object of the appended claims to cover all such variations as come within the true spirit and scope of this invention.

What is claimed as new and desired to be secured by Letters Patent of the United States is:

1. A digital latch circuit comprising:
   a. input logic means for receiving a plurality of digital input signals which form a plurality of groups of signals and for generating an output signal in response to selected logic operations being serially performed on the input signals, said input logic means including plural current mode logic switch means connected in a plurality of serially-connected switch levels, the current mode logic switch means of each switch level being connected to respond to one of the groups of the input signals;
   b. enabling means connected to said input logic means and further connected to receive a digital clock signal having a pass condition and a hold condition, said enabling means including switch means connected to said input logic means in a further switch level to enable said input logic means to transmit an output signal in response to said clock signal having the pass condition and disable it from transmitting the output signal in response to said clock signal having the hold condition;

c. feedback means connected to said input logic means and said enabling means for receiving the output signal and for maintaining the output signal in its condition when the clock signal switched from the pass condition to the hold condition in the response to the clock signal having the hold condition.

2. A digital latch circuit as defined in claim 1 wherein said enabling means comprises a differential switch means and said clock signal comprises a pair of differential signals, with each of the differential signals controlling one of the transistors in the differential switch means.

3. A digital latch circuit as defined in claim 1 wherein each said current mode logic switch means of the logic switch means includes an input transistor controlled by its connected group of input signals and a reference transistor controlled by a reference voltage signal, the input transistor of each current mode logic switch means for each level other than the first being connected to the current mode logic switch means of the preceding level and each current mode logic switch means for each level other than the first including voltage drop means connected to its reference transistor for dropping the voltage to its associated reference transistor to compensate for a voltage drop to its input transistor from the preceding level.

4. A digital latch circuit as defined in claim 1 in which said enabling signal generating means generates a hold signal when the clock signal is in the hold condition and wherein said current mode logic switch means for the first level is connected to two output lines each carrying an output signal, the two output signals being complementary, said feedback means comprising two switch means each associated with both of said output lines for coupling a complementary signal on the other of said output lines in response to the receipt of the hold signal.

5. A digital latch circuit as defined in claim 4 wherein each said switch means comprises a first transistor having a base terminal connected to one of said output lines and an output terminal connected to a base terminal of a second transistor, said second transistor having an output terminal connected to the other of said output lines and a control terminal connected to receive the hold signal, said second transistor being enabled to couple the complement of the signal on the line controlling the first transistor onto the line to which it is connected in response to the receipt of the hold signal from the enabling means.

6. A digital latch circuit as defined in claim 5 wherein said feedback means further includes a set/reset current mode logic switch means having a reference transistor means connected in the current path between said second transistors of said switch means and said enabling means and a set transistor connected between one of said output lines and said enabling means and a reset transistor connected between the other of said output lines and said enabling means, said set and reset transistors being controlled by set and reset signals to establish said output lines to predetermined conditions when said enabling means is transmitting said hold signal.

7. A digital latch circuit as defined in claim 1 further comprising buffer means connected to said input logic means for receiving the output signals from said input logic means and transmitting a buffered output signal in response thereto, said buffer means comprising buffer transistor means having a base terminal controlled by said output signal from said input logic means and an output terminal for transmitting the buffered output signal.

8. A digital latch circuit as defined in claim 7 wherein said buffer transistor means comprises emitter follower transistor means in which said output terminal comprises the emitter of said buffer transistor means.

9. A digital latch circuit comprising:

a. input logic means for receiving a plurality of digital input signals in a plurality of groups of signals and for generating an output signal in response to selected logic operations being serially performed on the input signals, said input logic means including plural current mode logic switch means connected in a plurality of serially-connected switch levels, each current mode logic switch means including a reference transistor and an input transistor, with the input transistor of each level being connected to form the current source for the current mode logic switch means of the preceding level, the current mode logic switch means of each switch level being connected to respond to one of the groups of the input signals;

b. enabling means connected to said input logic means and further connected to receive a digital clock signal having a pass condition and a hold condition, said enabling means including a differential switch means having an input transistor connected to said current mode logic switch means in a further switch level to enable said input logic means to transmit an output signal in response to said clock signal having the pass condition and disabling it from transmitting the output signal in response to said clock signal having the hold condition;

c. feedback means connected to said input logic means and said enabling means for receiving the output signal and for maintaining the output signal in response to the clock signal having the hold condition.

10. A digital latch circuit as defined in claim 9 wherein each said current mode logic switch means of the logic switch means includes an input transistor controlled by its connected group of input signals and a reference transistor controlled by a reference voltage signal, the input transistor of each current mode logic switch means for each level other than the first being connected to the current mode logic switch means of the preceding level and each current mode logic switch means for each level other than the first including voltage drop means connected to its reference transistor for dropping the voltage to its associated reference transistor to compensate for a voltage drop to its input transistor from the preceding level.

11. A digital latch circuit as defined in claim 10 in which said enabling signal generating means generates a hold signal when the clock signal is in the hold condition and wherein said current mode logic switch means for the first level is connected to two output lines each carrying an output signal, the two output signals being complementary, said feedback means comprising two switch means each associated with both of said output lines for coupling a complementary signal on the other of said output lines in response to the receipt of the hold signal.

12. A digital latch circuit as defined in claim 11 wherein each said switch means comprises a first transistor having a base terminal connected to one of said output lines and an output terminal connected to a base terminal of a second transistor, said second transistor having an output terminal connected to the other of said output lines and a control terminal connected to receive the hold signal, said second transistor being enabled to couple the complement of the signal on the line controlling the first transistor onto the line to which it is connected in response to the receipt of the hold signal from the enabling means.

13. A digital latch circuit as defined in claim 12 wherein said feedback means further includes a set/reset current mode logic switch means having a reference transistor means connected in the current path between said second transistors of said switch means and said enabling means and a set transistor connected between one of said output lines and said enabling means and a reset transistor connected between the other of said output lines and said enabling means, said set and reset transistors being controlled by set and reset signals to establish said output lines to predetermined conditions when said enabling means is transmitting said hold signal.

14. A digital latch circuit as defined in claim 9 further comprising buffer means connected to said input logic means for receiving the output signals from said input logic means and transmitting a buffered output signal in response thereto, said buffer means comprising buffer transistor means having a base terminal controlled by said output signal from said input logic means and an output terminal for transmitting the buffered output signal.

15. A digital latch circuit as defined in claim 14 wherein said buffer transistor means comprises emitter follower transistor means in which said output terminal comprises the emitter of said buffer transistor means.

16. A digital latch circuit comprising:
 a. input logic means for receiving a plurality of digital input signals which form a plurality of groups of signals and for generating an output signal in response to selected logic operations being serially performed on the input signals, said input logic means including plural serially-connected current mode logic switch means connected in a plurality of switch levels, the current mode logic switch means of each switch level being connected to respond to one of the groups of the input signals;
 b. enabling means connected to said input logic means and further connected to receive a digital clock signal having a pass condition and a hold condition for enabling said input logic means to transmit an output signal in response to said clock signal having the pass condition and disable it from transmitting the output signal in response to said clock signal having the hold condition;
 c. feedback means connected to said input logic means and said enabling means for receiving the output signal and for maintaining the output signal in its condition when the clock signal switched from the pass condition to the hold condition in the response to the clock signal having the hold condition.

* * * * *